US007074500B2

(12) United States Patent
Pfeiffer et al.

(10) Patent No.: US 7,074,500 B2
(45) Date of Patent: Jul. 11, 2006

(54) LIGHT EMITTING COMPONENT COMPRISING ORGANIC LAYERS

(75) Inventors: Martin Pfeiffer, Dresden (DE); Karl Leo, Dresden (DE); Jan Blochwitz-Niemoth, Dresden (DE); Xiang Zhou, Dresden (DE)

(73) Assignee: NovaLED GmbH, Dresden (DE)

( * ) Notice: Subject to any disclaimer, the term of this patent is extended or adjusted under 35 U.S.C. 154(b) by 90 days.

(21) Appl. No.: 10/432,173

(22) PCT Filed: Nov. 20, 2001

(86) PCT No.: PCT/DE01/04422

§ 371 (c)(1),
(2), (4) Date: Oct. 21, 2003

(87) PCT Pub. No.: WO02/41414

PCT Pub. Date: May 23, 2002

(65) Prior Publication Data

US 2004/0062949 A1    Apr. 1, 2004

(30) Foreign Application Priority Data

Nov. 20, 2000    (DE) ............................... 100 58 578

(51) Int. Cl.
*H05B 33/12*    (2006.01)
(52) U.S. Cl. ..................... 428/690; 428/917; 428/332; 313/504; 313/506
(58) Field of Classification Search ................ 428/690, 428/917, 332; 313/504, 506
See application file for complete search history.

(56) References Cited

U.S. PATENT DOCUMENTS

| 5,093,698 A | | 3/1992 | Egusa .......................... 357/17 |
| 5,343,050 A | | 8/1994 | Egusa et al. ................... 257/40 |
| 5,674,597 A | | 10/1997 | Fujii et al. .................... 428/212 |
| 5,773,130 A | * | 6/1998 | So et al. ..................... 428/195.1 |
| 5,869,199 A | | 2/1999 | Kido ........................... 428/690 |
| 2004/0036071 A1 | * | 2/2004 | Yamazaki et al. ............. 257/59 |

FOREIGN PATENT DOCUMENTS

| EP | 0961330 | 12/1999 |
| EP | 1017118 | 7/2000 |
| WO | 0016593 | 3/2000 |

OTHER PUBLICATIONS

"Enhanced Electron Injection in Organic Electroluminescence Devices Using an Al/LiF Electrode" by Hung et al., *Applied Physics Letters, American Institute of Physics*, Jan. 13, 1997, vol. 70, No. 2, pp. 152-154.
"A Blue-Emitting Organic Electroluminescent Device Using a Novel Emitting Amorphous Molecular Material . . . . " by Noda et al., *Advanced Materials*, vol. 11, No. 4, Mar. 4, 1999, pp. 283-285.
"Low Voltage Organic Light Emitting Diodes Featuring Doped Phthalocyanine as Hole Transport Material" by Blochwitz et al., *Applied Physics Letters, American Institute of Physics*, vol. 73, No. 6, Aug. 10, 1998, pp. 729-731.
"Doped Organic Light Emitting Diodes Having a 650-nm-Thick Hole Transport Layer", by Yamamori et al., *Applied Physics Letters, American Institute of Physics*, vol. 72, No. 17, Apr. 27, 1998, pp. 2147-2149.
"High Efficient and Stable Organic Light-Emitting Diodes" by Vestweber et al., *Elsevier Science S.A., Synthetic Metals*, 1997, pp. 181-185, no month.
"Color-Variable Emission in Multilayer Polymer Electroluminescent Devices Containing Electron-Blocking Layer" b Hamaguchi et al., *Applied Physics Letters, American Institute of Physics*, vol. 35, No. 9, Sep. 1996, pp. 4813-4818.
"Multilayer White-Light-Emitting Organic Elecgroluminescent Device" by Kido et al., *Dept. of Materials Science & Engineering*, Yamagata University, vol. 267, Mar. 3, 1995, pp. 1332-1334.
"White -Light-Emitting Organic Electroluminescent Devices Based on Interlayer Sequential Energy Transfer" by Deshpande et al., *Applied Physics Letter, American Institute of Physics*, vol. 75, No. 7, Aug. 16, 1999, pp. 888-890.
"Use of Poly(9-vinylcarbazole) as Host Material for Iridium Complexes in High Efficiency Organic Light-Emitting Devices" by Yang et al., *American Physics Letter, American Institute of Physics*, vol. 39, No. 8, Aug. 1, 2000, pp. 828-829.

* cited by examiner

Primary Examiner—Dawn Garrett
(74) Attorney, Agent, or Firm—Baker Botts LLP

(57)    ABSTRACT

The invention relates to a light-emmiting component having organic layers, in particular to an organic light-emmiting diode. The component has at least one doped charge carrier transport layer (2), a light-emmiting layer (4) and contact layers (1, 5) and also has a blocking layer (3; 3') wherein an organic material is provided between the charge carrier transport layer (2, 2') and the light-emmiting layer (4). The energy levels of the charge carried transport layer are chosen in such a way that efficient doping is possible and the blocking layer nevertheless ensures that non-radiating recombination processes on the interface with the emitting layer are prevented.

13 Claims, 4 Drawing Sheets

LIGHT EMITTING COMPONENT COMPRISING ORGANIC LAYERS

CROSS-REFERENCE TO RELATED APPLICATIONS

This is a national application for International Application No. PCT/DE01/04422 which was filed on Nov. 20, 2001, and which published in German on May 23, 2002, which in turn claims priority from 100 58 578.7, which was filed on Nov. 20, 2000.

The invention relates to a light-emitting component comprising organic layers, including a blocking layer of organic material between a charge-carrier transport layer and a light-emitting layer.

BACKGROUND OF THE INVENTION

Since the demonstration of low operating voltages by Tang et al., 1987 [C. W. Tang et al. Appl. Phys. Lett. 51 (12) 913 (1987)], organic light-emitting diodes have been promising candidates for the realization of large-area displays. They consist of a sequence of thin (typically 1 nm to 1 µm) layers of organic materials, which preferably are produced by vacuum deposition or by spin-on deposition in their polymer form. After electrical contacting by metallic layers they form a great variety of electronic or optoelectronic components, such as for example diodes, light-emitting diodes, photodiodes and transistors, which, in terms of properties, compete with established components based on inorganic layers.

In the case of organic light-emitting diodes (OLEDs), light is produced and emitted by the light-emitting diode by the injection of charge carriers (electrons from one side, holes from the other) from the contacts into adjacent organic layers as a result of an externally applied voltage, subsequent formation of excitons (electron-hole pairs) in an active zone, and radiant recombination of these excitons.

The advantage of such organic components as compared with conventional inorganic components (semiconductors such as silicon, gallium arsenide) is that it is possible to produce large-area elements, i.e., large display elements (visual displays, screens). Organic starting materials, as compared with inorganic materials, are relatively inexpensive (less expenditure of material and energy). Moreover, these materials, because of their low processing temperature as compared with inorganic materials, can be deposited on flexible substrates, which opens up a whole series of new applications in display and illuminating engineering.

The basic construction of such a component includes an arrangement of one or more of the following layers:
1. Carrier, substrate
2. Base electrode, hole-injecting (positive pole), usually transparent
3. Hole-injecting layer
4. Hole-transporting layer (HTL)
5. Light-emitting layer (EL)
6. Electron-transporting layer (ETL)
7. Electron-injecting layer
8. Cover electrode, usually a metal with low work function, electron-injecting (negative pole)
9. Encapsulation, to shut out ambient influences.

While the foregoing represent the most typical case, often several layers may be (with the exception of the $2^{nd}$, $5^{th}$ and $8^{th}$ layers) omitted, or else one layer may combine several properties.

U.S. Pat. No. 5,093,698 discloses that the hole-conducting and/or the electron-conducting layer may be doped with other organic molecules, in order to increase their conductivity. Further research, however, has failed to advance this approach.

Additional known approaches for the improvement of electrical properties of OLEDs (i.e., especially operating voltage and light-emission efficiency) include:

1) Improving the light-emitting layer (novel materials) [Hsieh et al., U.S. Pat. No. 5,674,635];
2) Constructing the light-emitting layer from a matrix material and a dopant, where transfer of energy takes place from the matrix to the dopant and radiant recombination of excitons takes place only on the dopant [Tang et al., U.S. Pat. No. 4,769,292, U.S. Pat. No. 5,409,783, H. Vestweber, W. Riess: "Highly efficient and stable organic light-emitting diodes," in *Synthetic Metal* 91 (1997), pp. 181–185];
3) Producing polymers (capable of spin-on deposition) or substances of low molecular weight (capable of vacuum deposition) which combine a number of favorable properties (conductivity, layer formation), or producing them of a mixture of a variety of materials (especially in the case of polymer layers) [Mori et al., U.S. Pat. No. 5,281,489];
4) Improving the injection of charge carriers into organic layers by using a number of layers with stepwise coordination of their energy levels, or using appropriate mixtures of a number of substances [Fujii et al., U.S. Pat. No. 5,674,597, U.S. Pat. No. 5,601,903, Sato et al., U.S. Pat. No. 5,247,226, Tominaga et al., Appl. Phys. Lett. 70 (6), 762 (1997), Egusa et al., U.S. Pat. No. 5,674,597];
5) Improving the transport properties of transport layers by admixing a more suitable material with the transport layer. There, transport takes place in for example the hole layer on the dopant/the admixture (in contrast to the doping mentioned above, in which transport of the charge carriers takes place on the molecules of the matrix material) [Y. Hamada et al., EP 961,330 A2].

Unlike light-emitting diodes based on inorganic materials, which have long found wide use in practice, organic components have hitherto had to be operated at considerably higher voltages. The reason for this is believed to be due to the poor injection of charge carriers from the contacts into organic layers and in the comparatively poor conductivity and mobility of charge-carrier transport layers. A potential barrier is formed at the contact material/charge-carrier transport layer interface, which makes for a considerable increase in operating voltage. The use of contact materials with a fairly high energy level (=low work function) for the injection of electrons into the adjacent organic layer, as is shown schematically in U.S. Pat. No. 5,093,698, or contact materials with still lower energy levels (higher work functions) for the injection of holes into an adjacent organic layer, might provide a remedy. However, the extreme instability and reactivity of the corresponding metals, and the low transparency of these contact materials undercut this potential remedy. In practice, therefore, at this time indium tin oxide (ITO) is used almost exclusively as the injection contact for holes (a transparent degenerate semiconductor), whose work function, however, is still too limited. Materials such as aluminum (Al), Al in combination with a thin layer of lithium fluoride (LiF), magnesium (Mg), calcium (Ca) or a mixed layer of Mg and silver (Ag) may be used for the injection of electrons.

The use of doped charge-carrier transport layers (p-doping of the HTL by admixture of acceptor-like molecules, n-doping of the ETL by admixture of donor-like molecules) is described in U.S. Pat. No. 5,093,698. Doping in this sense means that the admixture of doping substances into the layer increases the equilibrium charge-carrier concentration in this layer, compared with the pure layers of one of the two substances concerned, which results in improved conductivity and better charge-carrier injection from the adjacent contact layers into this mixed layer. The transport of charge carriers still takes place on the matrix molecules. According to U.S. Pat. No. 5,093,698, the doped layers are used as injection layers at the interface to the contact materials, the light-emitting layer being found in between (or, when only one doped layer is used, next to the other contact). Equilibrium charge-carrier thickness, increased by doping, and associated band bending, facilitate charge-carrier injection. The energy levels of the organic layers (HOMO=highest occupied molecular orbital or highest energetic valence band energy; LUMO=lowest unoccupied molecular orbital or lowest energetic conduction band energy), according to U.S. Pat. No. 5,093,698, should be obtained so that electrons in the ETL as well as holes in the HTL can be injected into the EL (emitting layer) without further barriers, which requires very high ionization energy of the HTL material and very low electron affinity of the ETL material. However, such materials are hard to dope, since extremely strong acceptors and donors would be required, so that these conditions cannot be fully met on both sides with materials that are actually available. Now, if HTL and ETL materials that do not meet these conditions are used, when voltage is applied an accumulation of charge carriers develops in the transport layers at the interfaces to the EL. Such an accumulation in principle promotes non-radiant recombination of excitons at the interface by, for example, the formation of exciplexes (these consist of a charge carrier in the HTL and ETL, and of the opposite charge carrier in the EL). Such exciplexes recombine mainly non-radiantly, so that exciplex formation represents a non-radiant recombination mechanism. In addition, the problem of exciplex formation becomes more acute when doped HTLs and ETLs are used, since in doped materials the Debye shielding length is very small and hence high charge-carrier thicknesses occur directly at the interface. In addition, dopants in the immediate vicinity of the EL may result in quenching of fluorescence by, for example, Förster transfer.

Blocking layers in OLEDs for improving the charge carrier balance in the respective light-emitting layer are disclosed in the literature. Their function consists of preventing charge carriers from leaving the light-emitting layer. In the case of electrons in the emitter layer, therefore, the condition is that the LUMO of the electron blocking layer (which is located between the emitter and the hole-transport layers) must lie distinctly over the LUMO of the emitter layer, and the blocking layer must be designed thick enough so that no tunneling of electrons into the following hole-transport layer can take place. For the holes in the emitter layer, the same conditions apply to the energies of the HOMOs. Examples of this may be found in: M.-J. Yang and A T. Tsutsui: "Use of poly(9-vinylcarbazole) as host material of iridium complexes in high-efficiency organic light-emitting devices" in Jpn. J. Appl. Phys. 39 (2000), Part 2, No. 8A, pp. L828–L829; R. S. Deshpande et al.: "White-light-emitting organic electroluminescent devices based on interlayer sequential energy transfer" in Appl. Phys. Lett. 75 (1999) 7, pp. 888–890; M. Hamaguchi and K. Yoshino: "Color-variable emission in multilayer polymer electroluminescent devices containing electron-blocking layer" in Jpn. J. Appl. Phys. 35 (1996), Part 1, No. 9A, pp. 4813–4818. The selection of suitable blocking layers and hence the restriction of possible emission zones is of special importance for the production of special blue OLEDs.

Reference to exciplex formation between organic emitter materials and undoped transport materials with low ionization energy are found in: K. Itano et al.: "Exciplex formation at the organic solid-state interface: yellow emission in organic light-emitting diodes using green-fluorescent tris(8-quinolinolato) aluminum and hole-transporting molecular materials with low ionization potentials" in Appl. Phys. Lett. 72 (1998) 6, pp. 636–638; T. Noda et al. "A blue-emitting organic electroluminescent device using a novel emitting amorphous molecular material, 5,5'-bis(dimesitylboryl)-2, 2'-bithiophene" in Adv. Mater. 11 (1999) 4, pp. 283–285. In the latter, the use of a blocking layer for reducing this effect is proposed, although not in connection with doped transport layers. The basic dilemma, that materials with deep-lying HOMO are hard to p-dope, but materials with high-lying HOMO promote exciplex formation at the interface to the emitting layer, has not yet been recognized in the scientific literature. Accordingly, there are also no known references that propose solutions to this problem.

SUMMARY OF THE INVENTION

The object of the present invention is to provide a light-emitting component using doped charge-carrier transport layers, which can be operated at a reduced operating voltage, and said component which has high light-emission efficiency. According to the present invention, this object is accomplished by providing a blocking layer between the doped charge-carrier transport layer and the light-emitting layer. The blocking layer is an organic material which prevents or effectively diminishes the occurrence of non-radiant recombination channels, in particular due to exciplex formation at the interface to the emitter layer. It is preferably for the energy levels of the blocking layers, charge-carrier transport layers and emitter layers to be adapted to one another as follows (see list of reference characters and numerals and FIG. 3):

a) Condition for p-doped hole-transport layer (2) and hole-side blocking layer (3):

$E_{Vp} > E_{Vblockp}$ (highest occupied molecular energy level (in the valence band, HOMO) of the injection and transport layer for holes>HOMO energy of the hole-side blocking layer);

b) Condition for n-doped electron-transport layer (2') and electron-side blocking layer (3'):

$E_{Cn} < E_{Cblockn}$ (lowest unoccupied molecular energy level (conduction band and LUMO) of the injection and transport layer for electrons<LUMO energy of the electron-side blocking layer);

c) Condition for hole-side blocking layer (3) and emitting layer (4):

$E_{Vblockp} - E_{Vel} < 0.3$ eV (HOMO energy of hole-side blocking layer—HOMO energy of light-emitting layer <0.3 eV);

d) Condition for electron-side blocking layer (3') and emitting layer (4):

$E_{Cblockn} - E_{Cel} > -0.3$ eV (LUMO energy of electron-side blocking layer—LUMO energy of light-emitting layer >−0.3 eV). Any deviations from the stated values should always correspond to several kT at the operating temperature of the component (in this context, several kT means up to 5 kT, i.e., approx. 5*25 meV at room temperature).

The charge-carrier transport layer is doped by an admixture of an organic and/or inorganic substance (dopant). The energy level of the majority charge-carrier transport state is selected so that, with the given dopant, efficient doping is possible (i.e., as complete as possible charge transfer from matrix to dopant). According to the invention, the blocking layer is located between the charge-carrier transport layer and a light-emitting layer of the component, in which conversion of the electric energy of the charge carrier injected by flow of current through the component takes place in light. According to the invention, the substances of the blocking layer are selected so that when voltage is applied (in the direction of the operating voltage), because of its energy level no accumulation of majority charge carriers (HTL-side: holes, ETL-side: electrons) in the blocking layer occurs at the interface to the emitting layer. In order to realize this condition simultaneously with the demand for more efficient dopability, an energy barrier for the injection of charge carriers from the transport layer into the blocking layer is provided.

In this respect, this approach clearly differs from that presented in the patent of Ogura et al., EP 1,017,118 A2. None of the examples listed in this reference meets the above conditions. Accordingly, the light-emitting diodes disclosed therein are also clearly poorer with respect to operating voltage as well as to efficiency than the examples of the present invention. The blocking layer proposed in patent EP 1,017,118 A2 acts only to prevent the injection of minority charge carriers. This function can also be satisfied by the blocking layer of the present invention, which in addition meets the condition that minority charge carriers are efficiently arrested at the light-emitting layer/blocking layer interface.

In a preferred embodiment of the light-emmiting component of the present invention, the energy levels of the blocking layers and of the emitter layer therefore satisfy the following conditions:

a) Condition for hole-side blocking layer (3) and emitting layer (4):

$E_{Cblockp} > E_{Cel}$ (LUMO energy of hole-side blocking layer>LUMO energy of light-emitting layer);

b) Condition for electron-side blocking layer (3') and emitting layer (4).

$E_{Vblckp} < E_{Vel}$ (HOMO energy of electron-side blocking layer<HOMO energy of light-emitting layer).

An advantageous feature of a component of the present invention is that the energy gap of the doped transport layers is selected large enough so that injection of minority charge carriers from the emitting layer into the doped transport layer is not even possible when the blocking layer is so thin that it can be tunneled through. According to the invention, this is accomplished in that the following conditions are met:

a) Condition for p-doped hole-transport layer (2) and emitting layer (4):

$E_{Cp} > E_{Cel}$ (LUMO of injection and transport layer for holes>LUMO energy of light-emitting layer);

b) Condition for electron-side blocking layer (2') and emitting layer (4):

$E_{Vn} < E_{Vel}$ (HOMO energy of injection and transport layer for electron<HOMO energy of light-emitting layer).

A preferred embodiment of a structure of an OLED according to the present invention contains the following layers:

1. Carrier, substrate;
2. Base electrode, hole-injecting (anode=positive pole), preferably transparent;
3. p-doped hole-injecting and transporting layer;
4. Hole-side blocking layer (typically thinner than p-doped layer in item 3) of a material whose band levels match the band levels of the enclosing layers;
5. Light-emitting layer;
6. Thinner electron-side blocking layer of a material whose band positions match the band positions of the layers enclosing them;
7. Highly n-doped electron-injecting and transporting layer;
8. Cover electrode, usually a metal with low work function, electron-injecting (cathode=negative pole); and
9. Metal protection, to shut out ambient influences.

According to the present invention, the substances of the blocking layers are selected so that when voltage is applied (in the direction of the operating voltage), their energy levels allow them to inject charge carriers efficiently into the light-emitting layer (EL). Non-radiant recombination processes such as exciplex formation at the interface to the EL are unlikely, and charge carriers in the EL cannot be injected into the said second layer. This means that the substances of the blocking layers, according to the present invention, are selected so that when voltage is applied (in the direction of the operating voltage), because of their energy levels they arrest majority charge carriers (hole-side: holes, electron-side: electrons) mainly at the doped charge-carrier transport layer/blocking layer interface, but arrest minority charge carriers efficiently at the light-emitting layer/blocking layer interface.

It is likewise within the scope of the present invention where only one blocking layer is used, because the band levels of the injecting and transporting layer and of the light-emitting layer already match one another on one side. Alternatively, only one side (hole- or electron-conducting) may be doped. In addition, the functions of charge-carrier injection and of charge-carrier transport into layers 3 and 7 (as defined hereinabove) may be divided among a number of layers, of which at least one is doped. Molar doping concentrations typically lie in the range of 1:10 to 1:10000. If the dopants are substantially smaller than the matrix molecules, in exceptional cases, there may be more dopants than matrix molecules in the layer (up to 5:1). The dopants may be organic or inorganic. Typical layer thicknesses for the blocking layers lie in the range of 1 nm to 20 nm, but they may be thicker. Typically, the blocking layers are thinner than their corresponding adjacent doped layers. The layer thicknesses of the blocking layers must be great enough to prevent exciplex formation between charged molecules of the substances in the corresponding adjacent mixed layers and charged molecules of the electroluminescent layer and quenching of luminescence by dopants themselves.

In summary, the accomplishment according to the invention may be described as follows: In order to be able to p-dope an organic transport material efficiently (described herein only for the hole side, with the electron side following analogously with exchange of the terms HOMO and LUMO), its ionization potential must be relatively small, owing to which a greater HOMO distance between the transport layer and the emitter layer is obtained. A consequence of efficient doping is that all dopants are present in the layer completely ionized (in the case of p-doping the dopants, the acceptors, are all negatively charged). Therefore, electron injection from the emitter layer to the dopants of the transport layer is no longer possible. This disadvantage, which no longer exists with efficient doping, is discussed in the patent of Ogura et al., EP 1,017,118 A2 where it is addressed by blocking layers for preventing the injection of electrons from the emitter layer into the hole-transport layer. In contrast to this, the blocking layer of the present invention may be extremely thin, since it is designed mainly to prevent exciplex formation but need not represent a tunnel barrier for charge carriers as in the Ogura et al., EP 1,017,118 A2 reference.

BRIEF DESCRIPTION OF THE DRAWINGS

The invention is described below in greater detail by means of exemplary embodiments and the drawings, in which.

In the drawings.

DETAILED DESCRIPTION OF THE INVENTION

Figure 1:
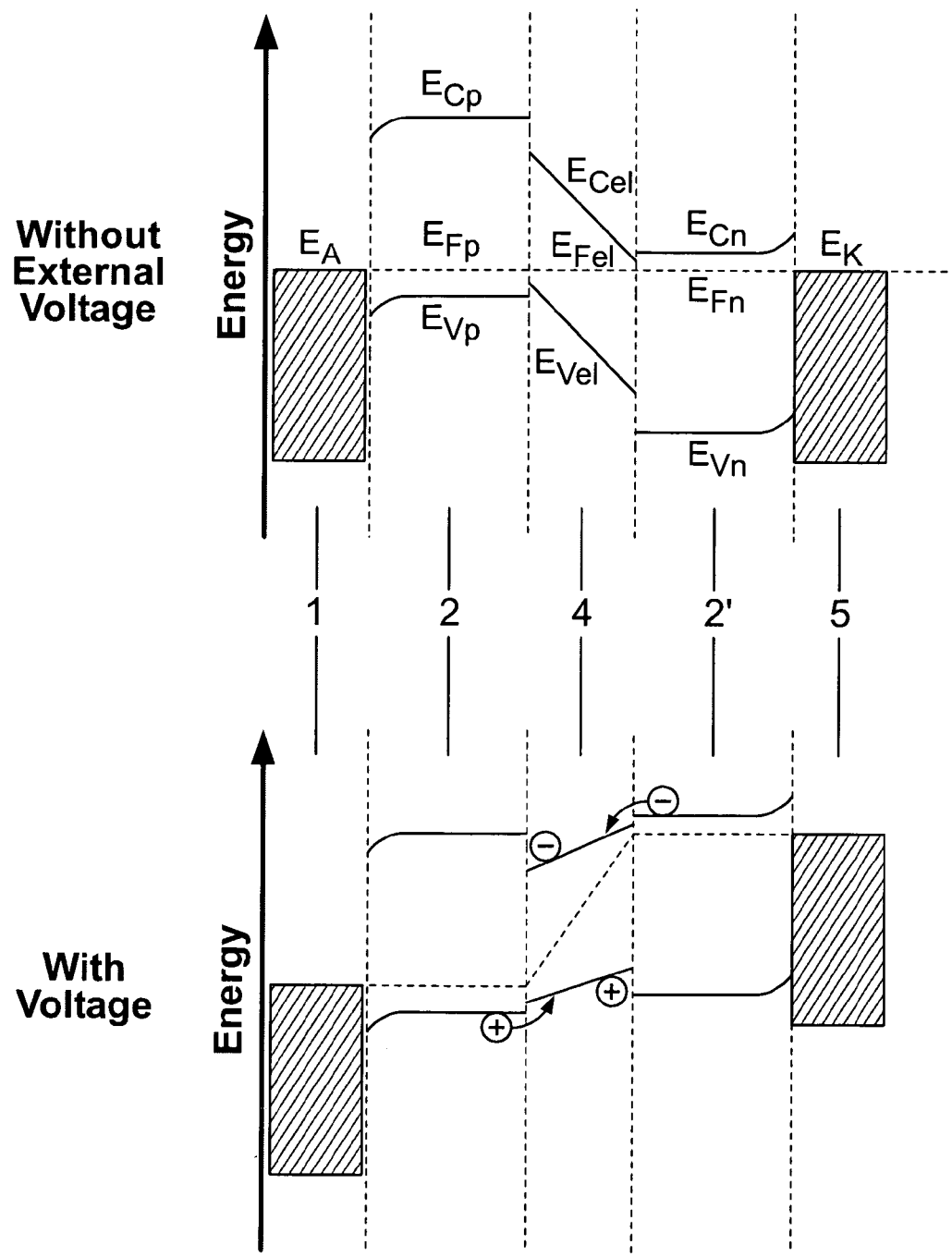
FIG. 1 illustrates a theoretically ideal doped OLED structure.
Figure 2:
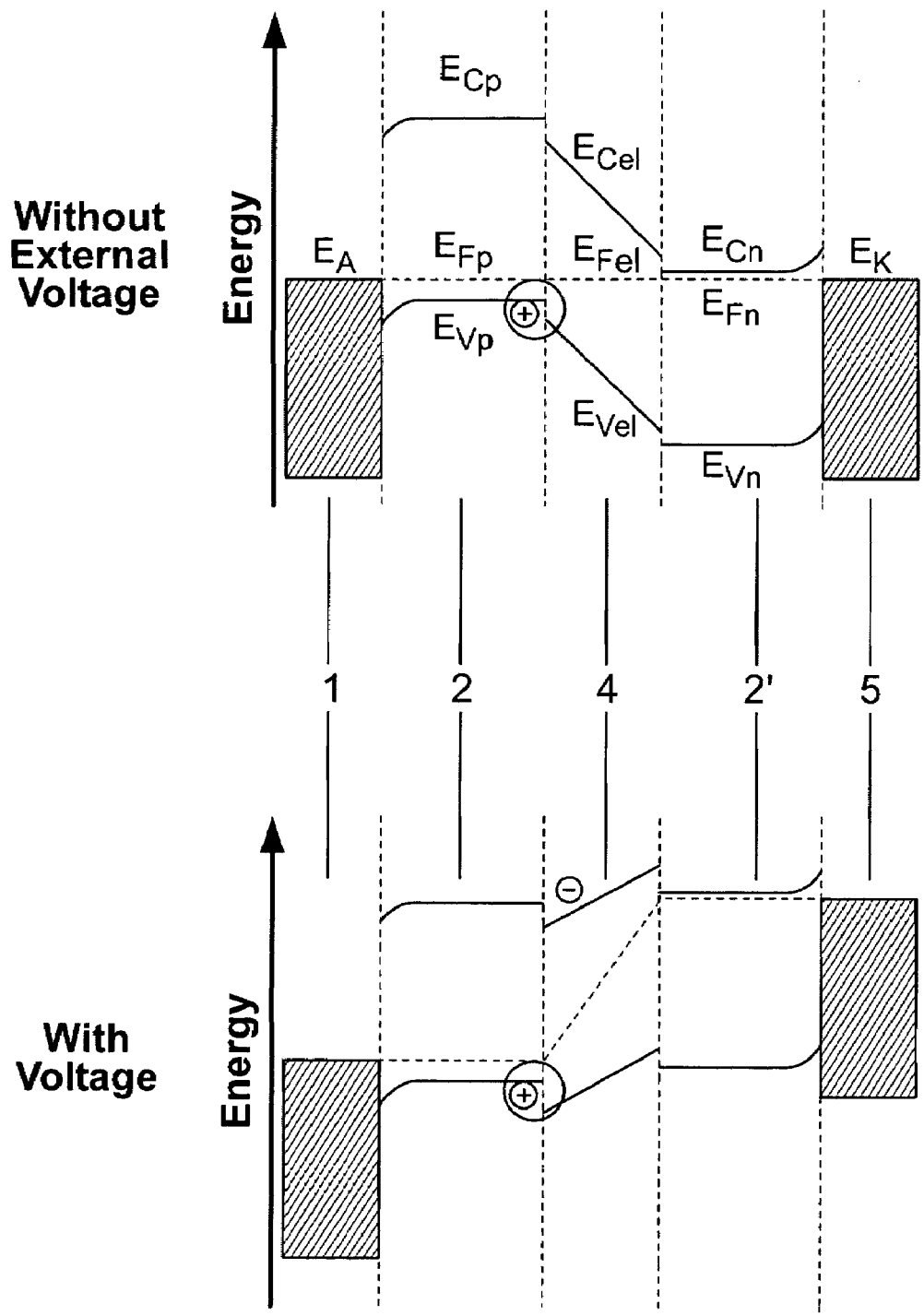
FIG. 2 illustrates an existing doped OLED without blocking layer.

A theoretically ideal structure is represented in FIG. 1, comprising an anode (EA), a highly p-doped hole-injection and transport layer ($E_{Vp}$, $E_{Cp}$, $E_{Fp}$), an electroluminescent layer ($E_{Vel}$, $E_{Cel}$, $E_{Fel}$), a highly n-doped electron-injecting and transporting layer ($E_{Vn}$, $E_{Cn}$, $E_{Fn}$), and a cathode. When voltage is applied (anode polarized positively), holes from the anode and electrons from the cathode are injected in the direction of the light-emitting layer. Since no barrier occurs ($E_{Vp} > E_{Vel}$) either for holes at the interface of the p-doped layer to the light-emitting layer, or for electrons at the interface of the n-doped layer to the light-emitting layer ($E_{Cn} > E_{Cel}$), and a high barrier exists ($E_{Cel} < E_{Cp}$ and $E_{Vel} > E_{Vp}$) at the interface of the light-emitting layer to the p-doped and n-doped layer for electrons and holes respectively, the charge carriers (electrons and holes) collect in the light-emitting layer, where they can efficiently form excitons and recombine radiantly. In reality, layer combinations with the parameters mentioned above are not yet to be found and perhaps may never be found, since these layers must bring together a great number of opposing properties. A realizable layer structure, however, is shown in FIG. 2 (schematic band levels).

The organic acceptor thus far best known for p-doping of organic materials (tetra-fluoro-tetracyano-quinodimethane $F_4$— TCNQ) is capable, because of its band level $E_{Cpdot}$, of doping materials efficiently at a valence band level of about $E_{Vp} = 5 \ldots -5.3$ eV. The material most used for producing electroluminescence, aluminum-tris-quinolinate ($Alq_3$) has a valence band level of $E_{Vel} = -5.65$ eV. Thus, the holes conducted into the p-doped layer are blocked at the interface to the electroluminescent layer ($E_{Vp} > E_{Vel}$). The same applies to the interface between n-doped and light-emitting layer ($E_{Cn} < E_{Cel}$), since the conduction band of a green or blue emitter material is very far removed from the valence band (great $E_{Cel} - E_{Vel}$ band gaps). However, in order to obtain good conversion efficiency, the band levels at the transition from the light-emitting layer to the p-conducting layer for electrons, and the light-emitting layer to the n-conducting layer for holes must be obtained so that electrons and holes are also efficiently blocked ($E_{Cel} < E_{Cp}$ and $E_{Vel} > E_{Vn}$), as described earlier for the theoretically ideal case. However, when voltage is applied, charge carriers accumulate at the interfaces of the doped layers to the light-emitting layer. Upon accumulation of an opposite charge on two sides of an interface, increased non-radiant recombination processes occur due, for example, to formation of exciplexes, which again reduces the efficiency of conversion of electrical into optical energy. Thus, with an LED having this layer structure, the operating voltage can be reduced by doping, but only at the cost of efficiency.

Figure 3:
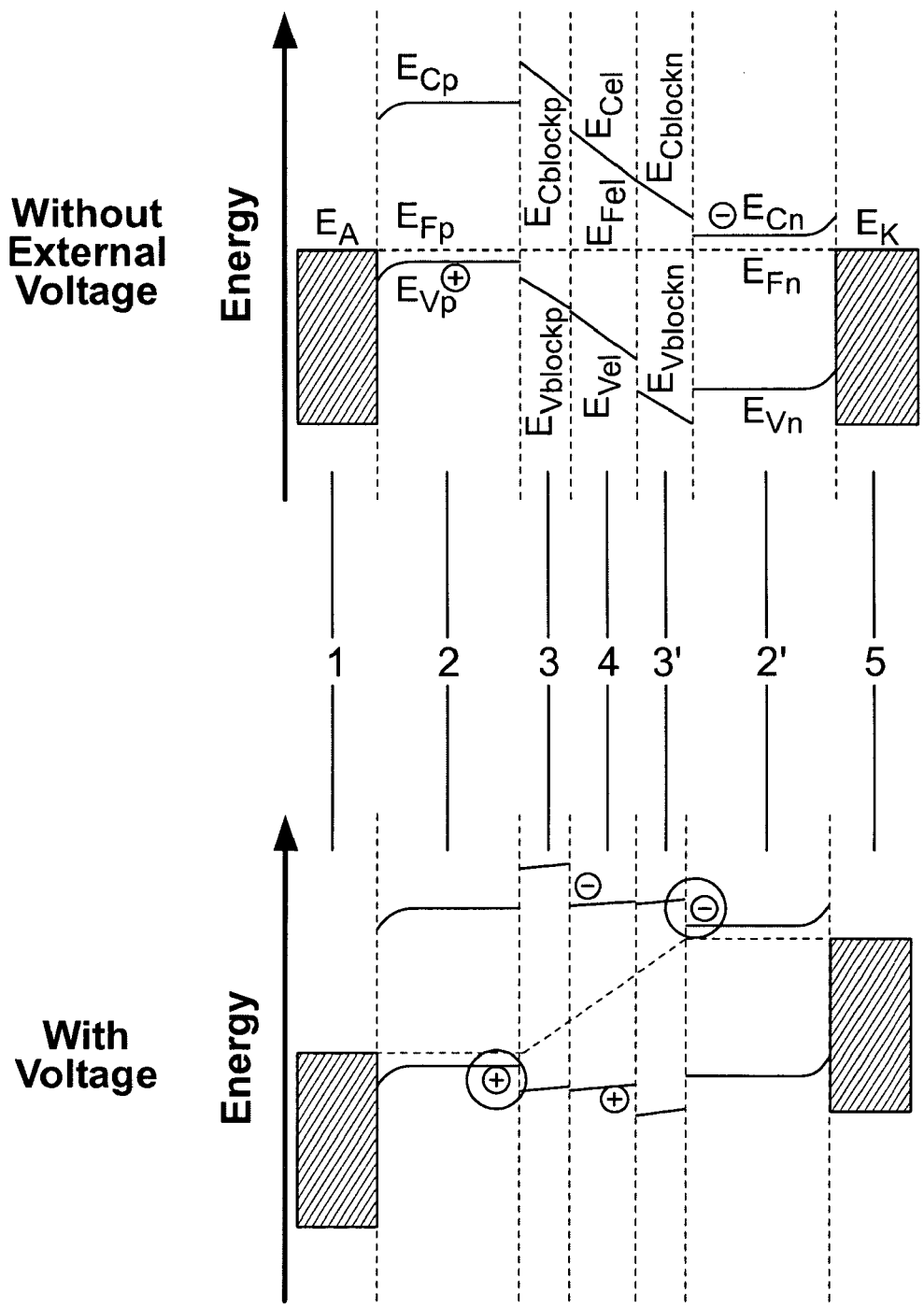
FIG. 3 illustrates a doped OLED with blocking layers.

According to the present invention, the disadvantage of the previous structures is avoided by OLEDs with doped injection and transport layers in combination with blocking layers. FIG. 3 shows a suitable arrangement. Between the hole-injecting and conducting layer and the light-emitting layer, there is located an additional layer, the hole-side blocking layer. The most important conditions for the selection of this layer are: $E_{Vblockp} - E_{Vel} < 0.3$ eV, so that holes at the hole-conducting blocking layer/light-emitting layer interface are not blocked. In addition, the following must apply: $E_{Cblockp} > E_{Cel}$, so that electrons cannot leave the light-emitting layer. Similarly, the following must apply on the electron side: $E_{Cblockn} - E_{Cel} > -0.3$ eV and $E_{Vblockn} < E_{Vel}$. Since in reality efficient doping is possible only if $E_{Vp} > E_{Vel}$, and $E_{Cn} < E_{Cel}$, holes at the p-doped layer/hole-side blocking layer interface and at the light-emitting layer/electron-side blocking layer interface are weakly blocked; and electrons at the interfaces of the n-doped layer to the electron-side blocking layer and light-emitting layer to the hole-side blocking layer are weakly blocked. Thus, the charge carriers of various polarities are in each instance spatially separated by the thickness of the blocking layers. Since this separation via a few molecular monolevels already prevents exciplex formation quite efficiently, a very small layer thickness of a few nm is sufficient for the blocking layers. A further advantage of this arrangement is that dopants are no longer present in the immediate vicinity of excitons in the light-emitting layer, so that quenching of luminescence by dopants is ruled out.

This arrangement is characterized by the following advantages:

A high charge-carrier thickness of both kinds in the light-emitting layer even at low voltages;

Outstanding injection of charge carriers from anode and cathode into the p- and n-doping charge-carrier transport layers;

Outstanding conductivities in the doped layers;

Because of their small thickness only small voltage losses in the blocking layers;

No formation of exciplexes, because of spatial separation of charge carriers of unlike polarity; and No quenching by dopants.

Together, this results in high conversion efficiencies at low operating voltage for OLEDs having this layer structure. In this connection, mixed layers known in the literature, which increase the recombination efficiency of excitons, or likewise well-known phosphorescent material systems with their high quantum efficiency, may alternatively be used for the light-emitting layer.

Figure 4:
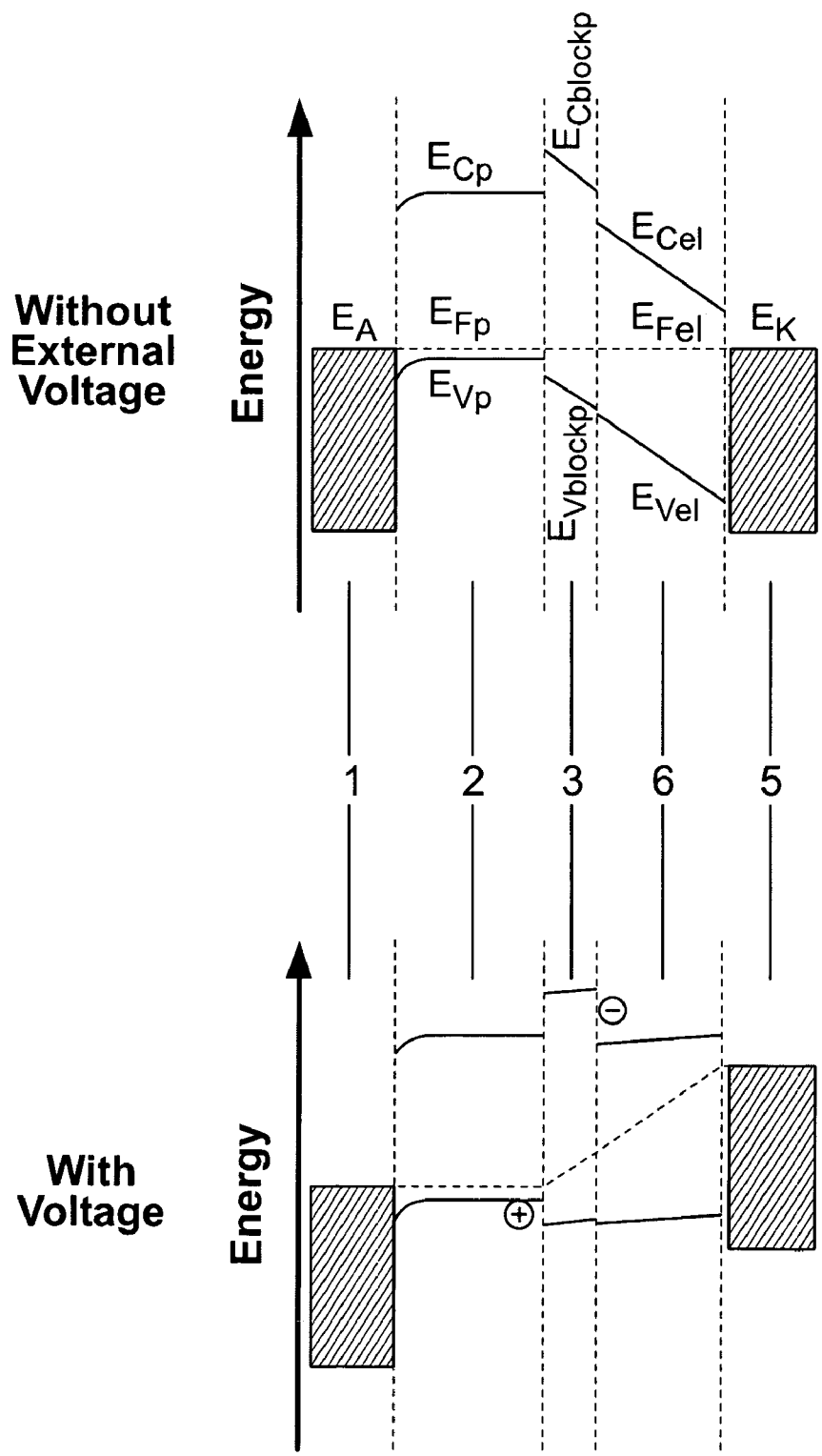
FIG. 4 illustrates an OLED doped only on the hole side, with blocking layer.

According to the present invention, layers doped on only one side (hole or electron side) may alternatively be used in combination with a blocking layer. This is illustrated in FIG. 4.

The layer sequence according to the present invention necessarily results in a stepwise increase of the transport levels $E_A < E_{Vp} < E_{Vblockp}$ on the hole side and, vice versa, a stepwise decrease of the transport levels $E_K < E_{Cn} < E_{Cblockn}$ on the electron side. The energy relationships in the structure according to the invention (as presented above) are so selected for the following reasons: The problem of the injection barrier of the contact in the transport layers is solved by the band bending in the doped layers and hence by tunnel injection, so that the energy levels become largely irrelevant for this. The energy levels of the layers to be doped are selected as described above because of the limited strength of available dopants, while the energy levels of the blocking layers act to prevent exciplex formation.

In a preferred embodiment, the combination of p-doped injection and transport layer and blocking layer is used only on the hole side. This OLED has the following layer structure:

1. Anode: indium tin oxide (ITO);
2. p-doped layer: 100 nm Starburst ATDATA 50:1 doped with $F_4$-TCNQ;
3. Hole-side blocking layer: 10 nm triphenyldiamine (TPD);
4. Electroluminescent and (in this case) conventional electron-conducting layer: 65 nm Alq3; and
5. Cathode: 1 nm LiF in combination with aluminum (LiF improves injection at the contact).

The mixed layer (2nd) was produced by a vacuum deposition process in mixed deposition. In principle, such layers may alternatively be produced by other methods, such as, for example, deposition on one another of the substances with subsequent possibly temperature-controlled diffusion of the substances into one another; or by other deposition (e.g., spin-on deposition) of the already mixed substances in or outside a vacuum. The blocking layer was likewise deposited under vacuum, but may alternatively be produced differently, e.g., by spin-on deposition in or outside a vacuum.

The energy levels of the HOMO and LUMO energies are:
1. ITO work function $E_A \approx -4.6$ eV (highly preparation-dependent);
2. TDATA: $E_{Vp}=-5.1$ eV, $E_{Cp} \approx -2.6$ eV;
3. TPD: $E_{Vblockp}=-5.4$ eV, $E_{Cblockp}=-2.3$ eV;
4. Alq3: $E_{Vel}=-5.65$ eV, EC, $=-2.9$ eV; and
5. Al: $E_K=-4.3$ eV.

In this arrangement, the requirements $E_{Vblockp}-E_{Vel}<0.3$ eV (0.25 eV difference) and $E_{Cblockp}>E_{Cel}$ (0.6 eV), as well as $E_{Vp}>E_{Vblockp}$ (0.3 eV) are met. In this preferred embodiment, the LUMO of the hole=transport layer (TDATA $E_{Cp}$) is distinctly higher (0.3 eV) than the LUMO of the emitter layer (Alq3 $E_{Cel}$). This is not absolutely necessary but is advantageous, in order to prevent tunneling of electrons from the emitter layer into the hole-transport layer through the thin blocking layer. At 3.4 V, this OLED has a luminescence of 100 cd/m², with an efficiency of 5 cd/A. With an undoped TDATA layer, 100 cd/m² are obtained only at about 7.5 V. In an OLED as described above, but without a TPD blocking layer, the characteristic data are: 8 V for 100 cd/M² and the efficiency is poorer by a factor of 10! This example illustrates how effective the combination of doped transport layer and blocking layer is with regard to optimization of operating voltage and light-emission efficiency.

An additional embodiment of the light-emmiting component according to the present invention is where additional small quantities (0.1–50%) of an emissive colorant are mixed into the emitter layer (in the literature, this admixture is also called doping—but not doping in the sense used herein—and admixtures therefore are called emitter dopants). These may, for example, be quinacridone in Alq3 in the example mentioned above or a triplet-emitter such as Ir(ppy) (tris(2-phenylpyridine)iridium) in matrix materials such as TCTA (tris(carbazolyl)-triphenylamine), BCP (bathocuproine), CBP (dicarbazole-biphenyl) and the like. For a triplet emitter, the concentration of the emitter dopant is usually greater than 1%. For these combinations of material, the blocking layer must prevent exciplex formation between the blocking layer materials and the emitter dopants. Exciplex formation in electron-hole pairs on molecules of blocking layer material and matrix material may thus be possible, as long as majority charge carriers are able to pass over directly (i.e., even without exciplex formation from electron-hole pairs on blocking layer molecules and emitter dopant molecules) into states of the emitter dopant, and therefore exciplex formation on blocking layer molecules/matrix molecules is then prevented. Therefore, the positions of HOMO and LUMO levels of the emitter dopant are important energy conditions for the connection of blocking layers to light-emitting layers:

a) Condition for hole-side blocking layer (3) and emitting layer with emitter dopant (4):

$E_{Vblockp}-E_{Veldotand}<0.3$ eV (HOMO energy of hole-side blocking layer —HOMO energy of emitter dopant in the light-emitting layer <0.3 eV); and b) Condition for electron-side blocking layer ($3^{rd}$) and emitting layer with emitter dopant (4):

$E_{Cblockn}-E_{Cel}>-0.3$ eV (LUMO energy of electron-side blocking layer—LUMO energy of emitter dopant in the light-emitting layer $>-0.3$ eV).

List of reference characters and numerals

| | |
|---|---|
| $E_A$ | work function of anode |
| $E_{Vp}$ | highest occupied molecular energy level (in the valence band, HOMO) of the injection and transport layer for holes |
| $E_{Cp}$ | lowest unoccupied molecular energy level (conduction band or LUMO) of the injection and transport layer for holes |
| $E_{Cpdot}$ | LUMO energy of p-doping material (acceptor) |
| $E_{Fp}$ | Fermi level of p-doped layer |
| $E_{Vblockp}$ | HOMO energy of hole-side blocking layer |
| $E_{Cblockp}$ | LUMO energy of hole-side blocking layer |
| $E_{Fblockp}$ | Fermi level of hole-side blocking layer |
| $E_{Vel}$ | HOMO energy of light-emitting layer |
| $E_{Cel}$ | LUMO energy of light-emitting layer |
| $E_{Fel}$ | Fermi level of light-emitting layer |
| $E_{Vblockn}$ | HOMO energy of electron-side blocking layer |
| $E_{Cblockn}$ | LUMO energy of electron-side blocking layer |
| $E_{Fblockn}$ | Fermi level of electron-side blocking layer |
| $E_{Vn}$ | HOMO energy of injection and transport layer for electrons |
| $E_{Cn}$ | LUMO energy of injection and transport layer for electrons |
| $E_{Vndot}$ | HOMO energy of n-doping material (donor) |
| $E_{Fn}$ | Fermi level of injection and transport layer for electrons |
| $E_K$ | work function of cathode |

Reference Numerals in FIGS. 1–4

| | |
|---|---|
| 1 | anode |
| 2 | hole-transport layer |
| 2' | electron-transport layer |
| 3 | hole-side blocking layer |
| 3' | electron-side blocking layer |
| 4 | light-emitting layer |
| 5 | cathode |
| 6 | electron-transporting and light-emitting layer |

We claim:
1. A light-emitting component comprising:
an anode for the injection of holes, a light-emitting layer;
a cathode for the injection of electrons, said light-emitting layer having a highest occupied energy level $E_{Vel}$ (HOMO), and a lowest unoccupied energy level $E_{Cel}$ (LUMO);
a hole-transport layer, and a first organic hole-side blocking layer, said first organic hole-side blocking layer having a highest occupied energy level $E_{Vblockp}$ (HOMO), and lowest unoccupied energy level $E_{Cblockp}$ (LUMO), and said hole-transport layer comprising a principal organic substance and an accepting doping substance, wherein the layers have energy levels defined as:

$$E_{Vblockp} - E_{Vel} < 0.3 \text{ eV}$$

$$E_{Cblockp} > E_{Cel}.$$

2. The light emitting component of claim 1, further comprising an electron-transport layer, and a second organic electron-side blocking layer, said second organic electron-side blocking layer having a highest occupied energy level $E_{Vblockn}$ (HOMO) and lowest unoccupied energy level $E_{Cblockn}$ (LUMO), and said electron-transport layer comprising a principal organic substance and a donating doping substance, wherein the layers have energy levels defined as:

$$E_{Cblockn} - E_{Cel} > -0.3 \text{ eV}$$

$$E_{Vblockn} < E_{Vel}.$$

3. The component according to claim 2, wherein the layers have energy levels further defined as: $E_{Vp} > E_{Vblockp}$, if $E_{Vp} > E_{Velp}$, and $E_{Cn} < E_{Cblockn}$, if $E_{Cn} < E_{Celn}$, said hole-transport layer having a highest occupied energy level $E_{Vp}$ (HOMO), said electron-transport layer having a lowest unoccupied energy level $E_{Cn}$ (LUMO), said light-emitting layer having a highest occupied energy level $E_{Velp}$ (HOMO) on a hole-injection side, and said light-emitting layer having a lowest unoccupied energy level $E_{Celn}$ (LUMO) on an electron-injection side.

4. The component according to claim 2, wherein the anode and cathode are metallic.

5. The component according to claim 1, wherein the layers are placed in the following sequence: hole-transport layer, blocking layer, light-emitting layer.

6. The component according to claim 2, wherein the light-emitting layer consists of a plurality of layers.

7. The component according to claim 2, further comprising a contact-improving layer provided between at least one contact from the group consisting of: the contact between the anode and the hole-transport layer and the contact between the electron-transport layer and the cathode.

8. The component according to claim 2, wherein the accepting doping substance in the hole-transport layer has a molar concentration in the range of 1:100,000 to 5:1, doping molecules to principal substance molecules.

9. The component according to claim 2, wherein the donating doping substance in the electron-transport layer has a molar concentration in the range of 1:100,000 to 5:1, doping molecules to principal substance molecules.

10. The component according to claim 2, wherein the thickness of at least one layer from the group of: the hole transport-layer, the hole-side blocking layer, the electron-transport layer, the electron-side blocking layer has a thickness in the range of 0.1 nm to 50 μm.

11. The component according to claim 9, wherein the hole-side blocking layer is thinner than the hole-transport layer, and the electron-side blocking layer is thinner than the electron-transport layer.

12. A light-emitting component comprising:
an anode for the injection of holes, a light-emitting layer;
a cathode for the injection of electrons, said light-emitting layer having a highest occupied energy level $E_{Vel}$ (HOMO), and a lowest unoccupied energy level $E_{Cel}$ (LUMO); and
an electron-transport layer, and a second organic electron-side blocking layer, said second organic electron-side blocking layer having a highest occupied energy level $E_{Vblockn}$ (HOMO) and lowest unoccupied energy level $E_{Cblockn}$ (LUMO), and said electron-transport layer comprising a principal organic substance and a donating doping substance, wherein the layers have energy levels defined as:

$$E_{Cblockn} - E_{Cel} > -0.3 \text{ eV}$$

$$E_{Vblockn} < E_{Vel}.$$

13. The light-emitting component of claim 12 further comprising a hole-transport layer, and a first organic hole-side blocking layer, said first organic hole-side blocking layer having a highest occupied energy level $E_{Vblockp}$ (HOMO), and lowest unoccupied energy level $E_{Cblockp}$ (LUMO), and said hole-transport layer comprising a principal organic substance and an accepting doping substance, wherein the layers have energy levels defined as:

$$E_{Vblockp} - E_{Vel} < 0.3 \text{ eV}$$

$$E_{Cblockp} > E_{Cel}.$$

* * * * *